(12) United States Patent
Agrawal et al.

(10) Patent No.: US 7,840,913 B1
(45) Date of Patent: Nov. 23, 2010

(54) RESTRICTING STATE DIAGRAMS WITH A SET OF PREDEFINED REQUIREMENTS TO RESTRICT A STATE DIAGRAM TO A STATE DIAGRAM OF A MOORE OR MEALY MACHINE

(75) Inventors: Aditya Agrawal, Cambridge, MA (US); Zhihong Zhao, Salem, NH (US); Beth Cockerham, Melrose, MA (US); Vijay Raghavan, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 578 days.

(21) Appl. No.: 11/394,574

(22) Filed: Mar. 31, 2006

(51) Int. Cl.
*G06F 17/50* (2006.01)
(52) U.S. Cl. .................. 716/1; 716/4; 716/5; 717/100; 717/104
(58) Field of Classification Search ............... 716/4–5, 716/1; 717/100, 104
See application file for complete search history.

(56) References Cited

U.S. PATENT DOCUMENTS

| 4,799,141 A * | 1/1989 | Drusinsky et al. ............ 700/12 |
| 2004/0117570 A1* | 6/2004 | Samuel et al. ............. 711/156 |
| 2005/0086627 A1* | 4/2005 | Brekne ..................... 716/18 |

OTHER PUBLICATIONS

"IAR visualState Version 4 workshop", http://www.cs.aau.dk/~kgl/TOV02/Training.doc @2002.*
"Behavioural VHDL Code Generation For Synchronous FSMs", by XJ Wang, SR W Grainger, and A Cooper @1992 IEEE.*
"Final Examination for ECE 152A", by professor Volkan Rodoplu, http://hkn.ece.ucsb.edu/exams/ECE152A/ECE152A_Final_W05.pdf, @2005.*
"State Editor", http://www.seas.upenn.edu/~ese201/foundation/foundation_StateEditor.html , by Jan Van Der Spiegel, Created Nov. 15, 1998; Updated May 17, 2000.*

* cited by examiner

*Primary Examiner*—Thuan Do
*Assistant Examiner*—Nha T Nguyen
(74) *Attorney, Agent, or Firm*—Lahive & Cockfield, LLP; Kevin J. Canning (57) ABSTRACT

The present invention provides a user of a state diagramming environment with the ability to specify if the user wants to develop a Moore machine or a Mealy machine. To achieve this, a set of predefined requirements is provided that restricts the state diagram semantics to either semantics of a Moore or Mealy machine. When a user provides a state diagram that does not conform to the set of requirements, the state diagram is identified as non-conforming and the user is notified of the non-conformance. The user is given information describing what aspects of the state diagram do not conform, thereby, allowing the user to quickly identify any errors that have been made. As a result of the present invention, the burden placed on the user is reduced and the time spent debugging is minimized.

17 Claims, 7 Drawing Sheets

RESTRICTING STATE DIAGRAMS WITH A SET OF PREDEFINED REQUIREMENTS TO RESTRICT A STATE DIAGRAM TO A STATE DIAGRAM OF A MOORE OR MEALY MACHINE

FIELD OF THE INVENTION

The present invention relates to a state diagram in a state diagramming environment. More specifically, the present invention relates to restricting the state diagram to a Moore or Mealy machine by providing a set of requirements.

BACKGROUND

State diagramming environments provide design tools for modeling and simulating event driven systems and subsystems. State diagrams enable the graphical representation of hierarchical and parallel states and the event driven transitions between them. The state diagrams include both logic and internal data. State diagrams can be used to visually detect a current state during the operation of the system being modeled. An example of a state diagramming environment is STATEFLOW from The MathWorks, Inc. of Natick, Mass.

A state diagram may be used to represent finite state machines. Finite state machines may be used to represent event based systems. An example of an event based system may be an electric circuit that has memory. In this manner, a finite state machine may be used in the design of a sequential circuit, which in general, is a circuit that uses combinational logic and a memory component. The output and next state of a finite state machine may be a function of the present state of and/or the inputs to the finite state machine.

Generally, there are three main types of finite state machines that are used to develop a synchronous sequential circuit, a Moore machine, a Mealy machine and a generic state machine. Currently, environments for developing state diagram representations of finite state machines using Mealy and Moore machines are insufficient for notifying a user when the user does not conform to Moore or Mealy machine semantics. As a result, a large burden on a user especially with increased complexity and size of the finite state machine. Debugging these finite state machines requires a substantial amount of the user's time.

SUMMARY OF THE INVENTION

To address the above described limitations of conventional systems, the present invention provides a user of a state diagramming environment with the ability to specify if the user wants to develop a Moore machine or a Mealy machine. To achieve this, a set of predefined requirements is provided that restricts the state diagram semantics to either semantics of a Moore or Mealy machine. The set of requirements are used to enforce the semantics of the Moore or Mealy machine depending on which machine the user desires. When a user provides a state diagram that does not conform to the set of requirements, the state diagram is identified as non-conforming and the user is notified of the non-conformance. The user is given information describing what aspects of the state diagram do not conform, thereby allowing the user to quickly identify any errors that have been made. As a result of the present invention, the burden placed on the user is reduced and the time spent debugging is minimized.

In one aspect of the present invention, a method in a computing system is disclosed. The method includes the steps of providing a state diagram in a state diagramming environment, and providing a set of predefined requirements to restrict a state diagram to a Moore machine. The method further provides the steps of identifying when the state diagram does not conform to the set of predefined requirements.

In another aspect of the present invention, a system in a computing system is disclosed. The system provides a state diagramming environment, and an editor for implementing a state diagram in the state diagramming environment. The system further provides a set of predefined requirements to restrict the state diagram to a Moore machine.

In yet another aspect of the present invention, a medium that holds instructions for performing steps that are executable with a computing device is disclosed. The instructions for performing enables the steps of providing a state diagram using an editor in a state diagramming environment, and providing a set of predefined requirements to restrict a state diagram to a Moore machine. The instructions for performing also enable the step of identifying when the state diagram does not conform to the set of predefined requirements.

In one aspect of the present invention, a method in a computing system is disclosed. The method includes the steps of providing a state diagram in a state diagramming environment, and providing a set of predefined requirements to restrict a state diagram to a Mealy machine. The method further provides the step of identifying when the state diagram does not conform to the set of predefined requirements.

In an additional aspect of the present invention, a system in a computing system is disclosed. The system provides a state diagramming environment, and an editor for implementing a state diagram in the state diagramming environment. The system further provides a set of predefined requirements to restrict the state diagram to a Mealy machine.

In a further aspect of the present invention, a medium that holds instructions for performing steps that are executable with a computing device is disclosed. The instructions for performing enables the steps of providing a state diagram using an editor in a state diagramming environment, and providing a set of predefined requirements to restrict a state diagram to a Mealy machine. The instructions for performing enable the step of identifying when the state diagram does not conform to the set of predefined requirements.

BRIEF DESCRIPTION OF THE DRAWINGS

The invention is described with particularity in the appended claims. The advantages of the invention summarized above, as well as further advantages of the invention, may be better understood by reference to the following description taken in conjunction with the accompanying drawings, in which:

DETAILED DESCRIPTION

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention provides a user of a state diagramming environment with the ability to construct either a Moore machine or a Mealy machine using a set of predefined requirements. According to the illustrative embodiment, a desired type of finite state machine may be specified by the user. For example, the user may specify that the user desires to develop a Moore machine. A set of predefined requirements restricts the state diagram semantics. In this manner, if a user desires to develop a Moore machine, for example, a set of predefined requirements directed to a Moore machine are enforced. The set of predefined requirements are therefore used to enforce the semantics of a state diagram based on the type of finite state machine the user desires to develop.

The illustrative embodiment further provides that a state diagram that does not conform to the set of requirements is identified by the state diagramming environment as being non-conforming. Accordingly, the user may be notified of the non-conformance with the set of predefined requirements. The user may be given information describing what aspects of the state diagram do not conform allowing the user to quickly identify any errors that have been made. As a result of the present invention, the burden placed on the user when developing Moore and Mealy machines is reduced, and the time spent debugging is minimized.

Figure 1:
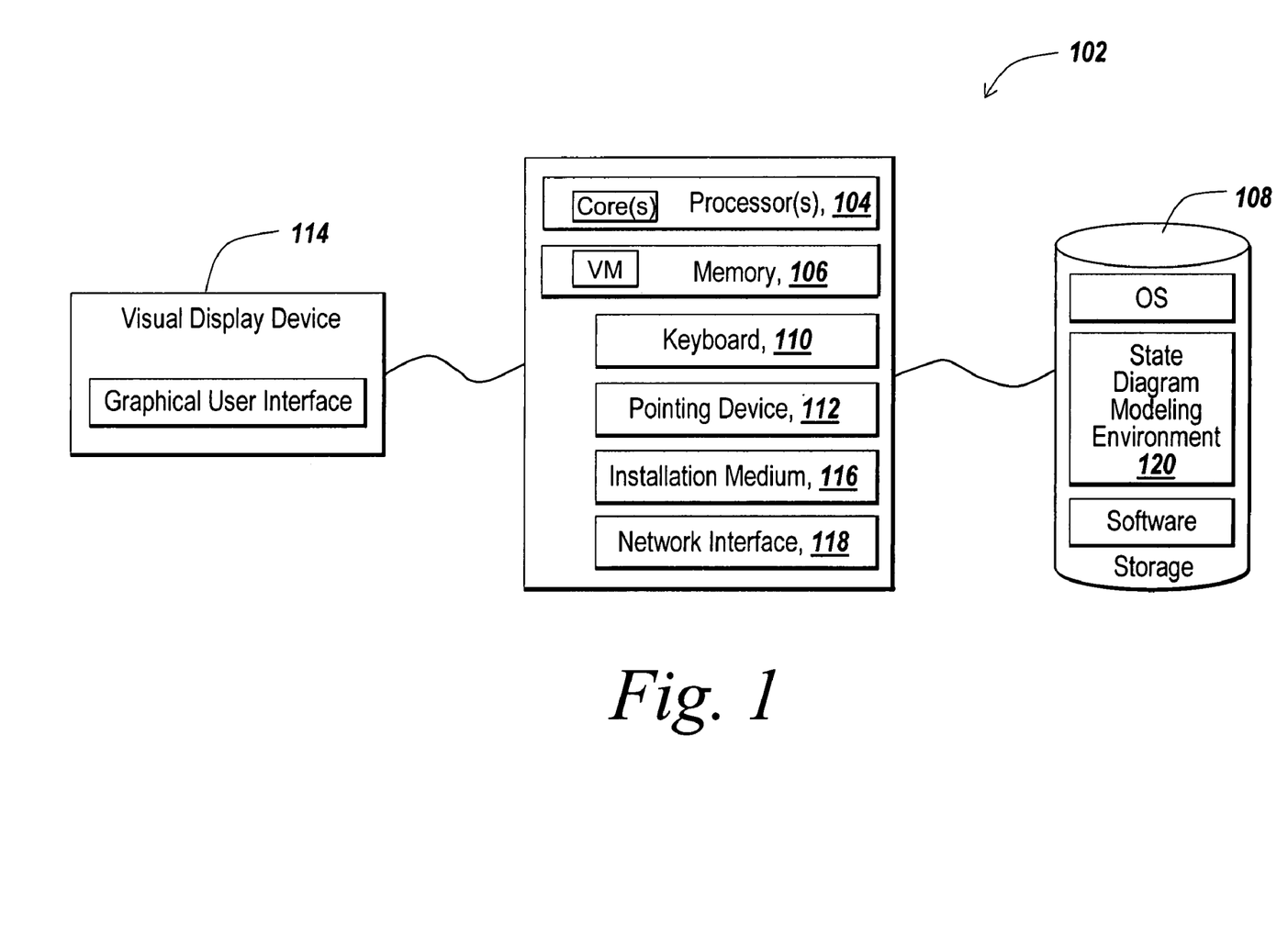
FIG. 1 is a block diagram of an illustrative computing device for practicing an embodiment of the present invention.

FIG. 1 depicts an environment suitable for practicing the illustrative embodiment of the present invention. The environment includes a computing device 102 having memory 106, on which software according to one embodiment of the present invention may be stored, a processor (CPU) 104 for executing software stored in the memory 106, and other programs for controlling system hardware. A user may interact with the computing device 102 through a visual display device 114 such as a computer monitor, which may be used to display a graphical user interface (GUI). The computing device 102 may include other I/O devices such a keyboard 110 and a pointing device 112, for example a mouse, for receiving input from a user. The computing device 102 may include other suitable conventional I/O peripherals. The computing device 102 may further comprise a storage device 108, such as a hard-drive, for storing an operating system and other related software. A state diagramming environment 120 may comprise of software that resides on storage device 108.

Optionally, the computing device 102 may include multiple CPUs for executing software loaded in the memory 106, and other programs for controlling system hardware. Each of the CPUs can be a single or multiple core processor. The code loaded in the memory 106 may run in a virtualized environment, such as in a Virtual Machine (VM). Multiple VM's may be resident on a single processor. Also, part of the application could be run in hardware, for example, by configuring a field programmable gate array (FPGA) or creating an application specific integrated circuit (ASIC). Further, the application may run on analog electronic devices or on other available resources such as, for example, a graphics processing unit (GPU).

Network interface 118 may be used to interface computing device 102 to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM). In addition the network may use middleware such as CORBA or DCOM to allow a computer on the network to communicate directly with a device on another computer that is connected to the network. The computing device 102 may be any computer system such as a workstation, desktop computer, server, laptop, handheld computer or other form of computing or telecommunications device that is capable of communication and that has sufficient processor power and memory capacity to perform the operations described herein.

Figure 2A:
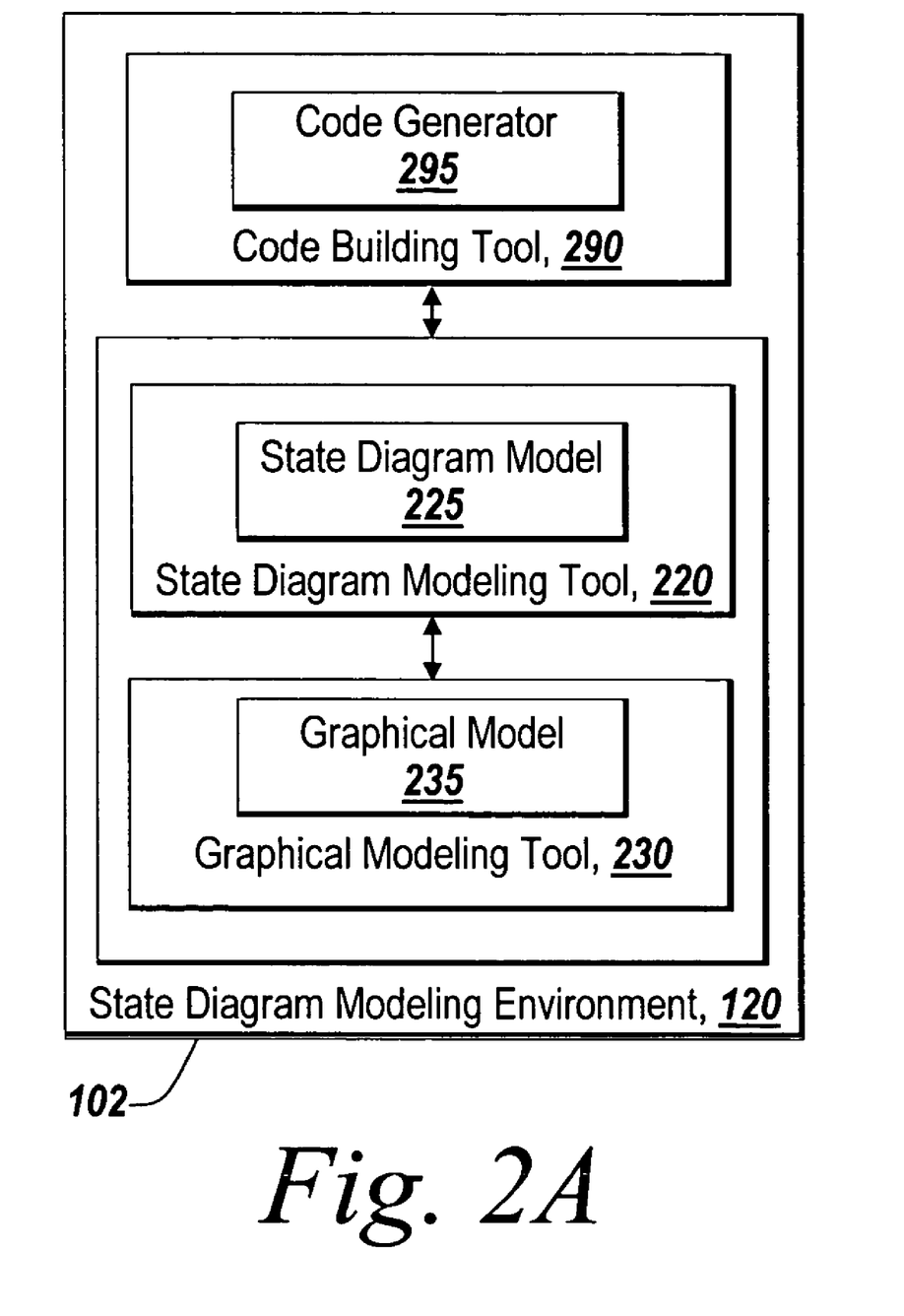
FIG. 2A is a block diagram of an illustrative state diagramming environment for practicing an embodiment of the present invention on the computing device of FIG. 1.

In one aspect, the present invention is related to a state diagramming environment 120 as illustrated in FIG. 2A. The state diagramming environment 120 may include a state diagram modeling tool 220, a graphical modeling tool 230, and a code building tool 290. The state diagram modeling tool 230 provides an environment for the design, development, testing, simulation, and execution of a state diagram model 225. The graphical modeling tool 230 may be provided to provide an environment for the design, development, testing, simulation, and execution of a graphical model 235, such as a block diagram model. One of ordinary skill in the art would recognize that the graphical modeling tool 230 is not necessary to carry out the operation of the illustrative embodiment. An element of the graphical model 235 may be a state diagram model 225.

The illustrative state diagram modeling tool 220 of the present invention comprises a design and development environment for creating any type and/or form of state diagram model 225, which may also be referred to as a state machine diagram model, a state diagram, a state transition diagram, a state transition table, a statechart or chart. In an exemplary embodiment and by way of example, the state diagram modeling tool 220 may comprise STATEFLOW by The MathWorks, Inc. of Natick, Mass. In the exemplary embodiment of STATEFLOW, the state diagram model 225 may be referred to as a STATEFLOW chart. STATEFLOW integrates with graphical modeling tools, such as SIMULINK by The MathWorks, Inc. of Natick, Mass., to model, simulate, and analyze systems. In one embodiment, STATEFLOW provides for the design and development of deterministic, supervisory control systems in a graphical environment. The state diagram modeling tool 220 provides for state machine representation, flow diagram notations, and state-transition diagrams all in the same diagram model 225.

A state diagram model 225 may comprise a graphical representation of a state machine, such as either an infinite state machine, a finite state machine, or a non-deterministic state machine, where states and transitions form the building blocks of a system. As known to those ordinarily skilled in the art, a state machine may be a representation of an event driven system, where the system makes a transition from one state to another state provided any conditions associated with the transition are met or a condition/event system. Further, one of ordinary skill in the art would recognize that Petri nets may be used to represent finite state machines including Moore and Mealy machines and that Petri nets are encompassed by the illustrative embodiment of the present invention. A state may be a mode of behavior that can be either active or inactive based on inputs, outputs, transitions, and conditions. A transition links one state to another state and may have a condition, such as any logic, computation, algorithm, or executable instruction, used to determine if and when a transition between states may occur.

In another embodiment of the present invention, a truth table, graphical or otherwise, may be used to represent the relationships between inputs, outputs, states, transitions, and conditions of a finite state machine. Although generally discussed herein as a graphical state diagram model, one ordinarily skilled in the art will recognize and appreciate that any type of graphical or non-graphical state model may be used. An example of a non-graphical state machine is a state machine that is implemented using embedded MATLAB®. Embedded MATLAB® provides textual language that may be used to implement a state diagram model. Additionally, the state diagram modeling tool 220 and/or state diagram model 225 may use any type and/or form of notation for state machine representation, such as any notation known by those ordinarily skilled in the art, or any notation suitable for practicing the operations of the present invention.

The state diagram modeling tool 220 may provide elements such as states, junctions, and functions, such as graphical functions of SIMULINK and/or STATEFLOW, that may be placed and arranged graphically in a window, design area or otherwise collectively in a state diagram model 225. States and junctions may be connected together in the state diagram model 225 to form flows and transitions for an implementation of a state machine. The state diagram modeling tool 220 and/or state diagram model 225 may provide for parallelism in that two or more orthogonal states may be active at the same time. Additionally, the state diagram modeling tool 220 and/or state diagram model 225 may provide a mechanism for specifying transitions and/or conditions based on historical information related to execution of the state diagram model 225. Additionally, the state diagram modeling tool 220 and/or state diagram model 225 may use any type and/or form of graphical element to visually represent elements, such as for state machine representation, in a state machine diagram model 225.

The state diagramming environment 120 may allow a state to be composed of multiple states and/or state diagrams. A hierarchy of states may be created where a global state is at the top of the hierarchy. The global state may include multiple states and sub-states.

Although the state diagram modeling tool 220 is generally discussed in view of STATEFLOW, one ordinarily skilled in the art will recognize and appreciate the various forms and types of state diagram modeling tools that may be used in practicing the operations of the present invention as described herein. For example, a state diagramming environment may be RHAPSODY and STATEMATE, from iLogic, Inc. of Toronto, Canada and DYMOLA from Dynasim AB of Lund, Sweden, a mixed-block diagram/statechart modeling and simulation environment such as SIMPLORER from Ansoft Corporation of Pittsburgh, Pa., a data flow diagram environment or a UML modeling environment. Additionally, one skilled in the art would recognize that in accordance with the illustrative embodiment Petri net representations may be used.

Additionally, in some embodiments, the state diagram modeling tool 220 may be able to execute the state diagram model 225. For example, in the exemplary embodiment of STATEFLOW, the state diagram modeling tool 220 has a graphical execution and debugging environment that provides a user control of the simulation execution of the state diagram model 225, and access to debug related tasks, such as setting breakpoints. Further, the debugging environment may provide the user with feedback identifying that a state diagram model does not conform to a set of predefined requirements for a specific type of state diagram model the user desires to develop. A user may specify the desire to develop a state diagram to represent a Moore or Mealy machine, for example, and the debugging environment may use a set of predefined requirements specific to a Moore or Mealy machine. Additionally, the state diagram modeling tool 220 may display information about the state machine, such as active and inactive states during execution or other information as requested or desired by the user.

In some embodiments, the state diagram modeling tool 220 is included in, integrated with, or is otherwise associated with a graphical modeling tool 230. The graphical modeling tool 230 of the present invention provides a graphical modeling environment for creating, designing, simulating, testing, and verifying a graphical model 235, such as a block diagram model. In an exemplary embodiment, the graphical modeling tool 230 includes the graphical modeling environment of SIMULINK from the MathWorks, Inc. of Natick, Mass. In the graphical modeling tool 230, configurable and customizable functional blocks are used to create block diagram models that may represent a design, or algorithm, for a control system, a signal processing system, a communication system, any other time-varying or dynamic system or any computational hardware device. In other embodiments, the state diagram modeling tool 220 is separate from the graphical modeling tool 230 but is otherwise interfaced or in communication with the graphical modeling tool 230.

The state diagram modeling environment 120 may include a code building tool 290 for generating code and building an executable form of the graphical model 235 and/or state diagram model 225. The code building tool 290 comprises a code generator 295, such as the automatic code generator of Real-Time Workshop® from The MathWorks, Inc. of Natick, Mass. The code generator 295 generates source code from a graphical model 235 and/or state diagram model 225 to translate the functionality of the graphical model 235 and/or state diagram model 225 into a program that may be designed to run on any processor, operating system, or otherwise customized to run on a specific target hardware platform. Further, the code building tool 290 may translate the graphical model 235 and/or state diagram model 225 into a hardware description language to allow a hardware implementation of the state diagram model 225.

In FIG. 2A, although the state diagram modeling tool 220, graphical modeling tool 230, and code building tool 290 are illustrated as separate tools, one ordinarily skilled in the art will recognize and appreciate that any combination or all of these tools 220, 230 and 290 may be combined into a single application, or otherwise tightly integrated to present a single application in performing the operations of the present invention as described.

Figure 2B:
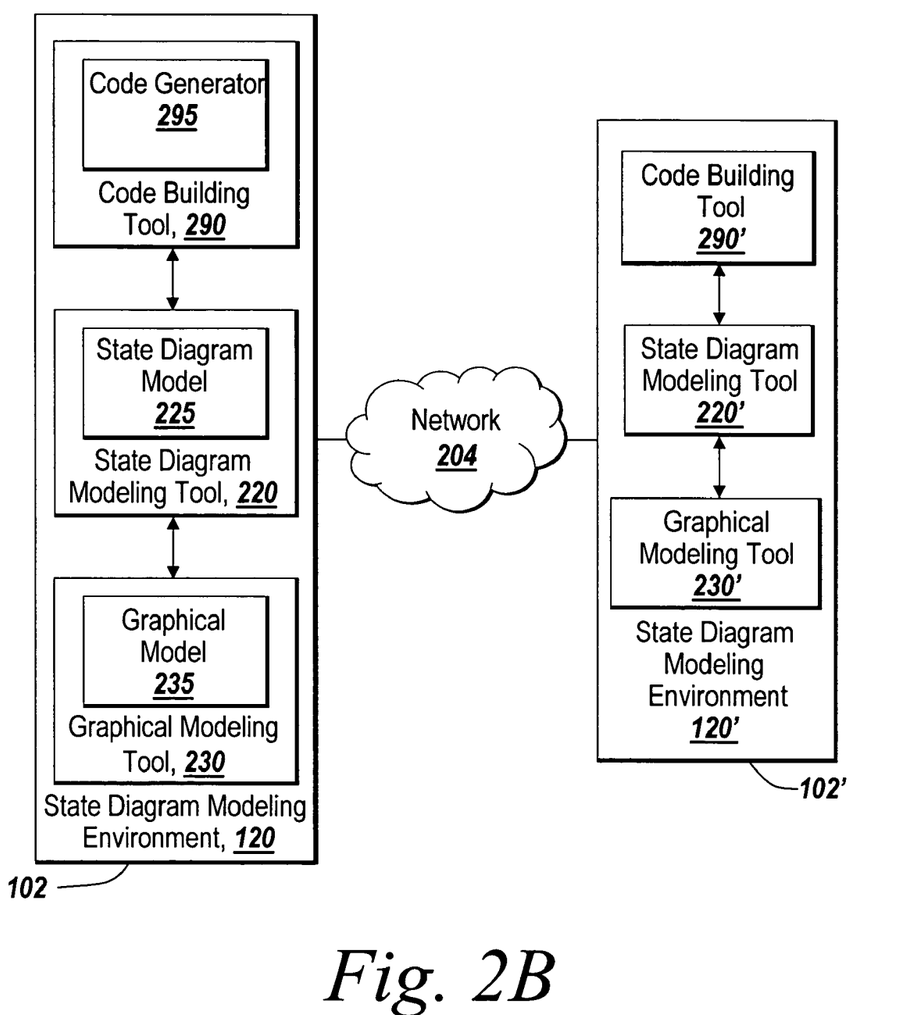
FIG. 2B is a block diagram of another illustrative state diagramming environment for practicing an embodiment of the present invention in a distributed environment.

FIG. 2B depicts another illustrative environment of an embodiment of the present invention, wherein portions of the present invention are practiced in a distributed network environment. The illustrative state diagram modeling environment 120 of the present invention includes a client computing device 102 connected to and in communication with a server computing device 102' over a network 204. The state diagram modeling tool 220, graphical modeling tool 230 and/or code building tool 290, may have the capability to and be configured to have respective portions run on each of the client 102 and the server 102'. In one embodiment, the state diagram modeling tool 210 may have a first portion running on the client 102 and a second portion 210' running on the server 102'. For example, the state diagram modeling tool 210 may have a client portion 210 on the client 102 for providing and displaying the state diagram model 225, and a server portion 210' on the server 102' that may include application functionality and other processing, such as storing and/or retrieving portions of the state diagram model 225 from a database. Likewise, in other embodiments, the graphical modeling tool 230 may also have a client portion 230 and a server portion 230', and the code building tool 290, a client portion 290 and a server portion 290'. One ordinarily skilled in the art will recognize and appreciate how the state diagram modeling tool 220, graphical modeling tool 230, and/or code building tool 290 may be capable of and configured to execute with a client portion and a server portion in a client/server architecture.

In summary, the state diagram modeling tool 220, graphical modeling tool 230, and code building tool 290 may be deployed across a wide range of different computing devices, different operating systems, and different processors. Furthermore, the state diagram modeling tool 220, graphical modeling tool 230, and code building tool 290, may be deployed in various distributed network environments with various network topologies and configurations.

The illustrative embodiment of the present invention aids a user developing Moore and Mealy machines. Moore and Mealy machines are well known to those skilled in the art. Mealy and Moore machines may be combined to create generic state machines that have characteristics of both Mealy and Moore machines.

A Mealy machine is a finite state machine that may represent an event based system. For example a Mealy machine may represent a synchronous sequential circuit, also referred to as a clocked sequential circuit. A Mealy machine that represents these types of circuits may be referred to as a clock synchronous state machine. Mealy machines may also represent un-timed systems for which the operation of the Mealy machine is not controlled by a clock. A Mealy machine may be considered a 6-tuple that includes a finite set of states, an initial state which is an element of the finite set of states, a finite set of inputs, a finite set of outputs, a transition function, and an output function. A Mealy machine may also include accepting states or final states within the finite set of states. The transition function maps a state and an input to the next state such that the next state is a function of the input and the present state. The output function maps each state to an output such that the output is a function of the input and the present state. An output of a Mealy machine, therefore, may change anytime a state transition occurs. The next state in a Mealy machine depends on the current state and the input. Therefore, state transitions of a Mealy machine occur based on the present state and the input. Mealy machines may represent clock synchronous state machines that use a clock signal to synchronize state changes to the clock signal.

Figure 3A:
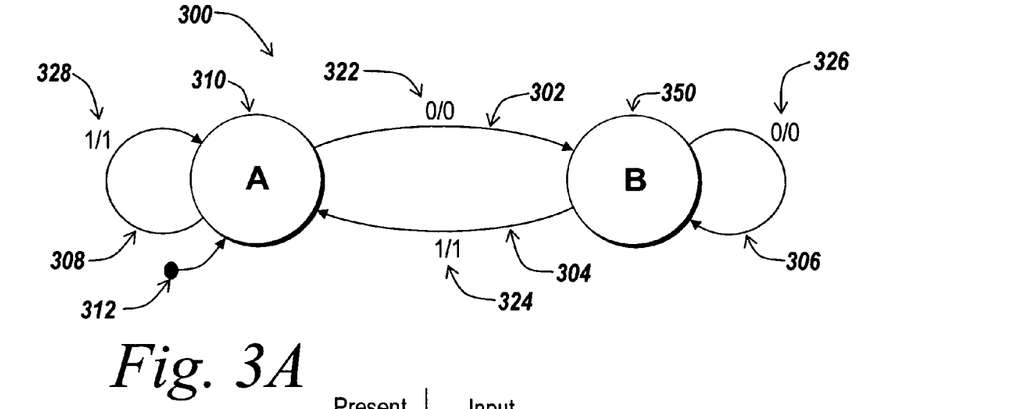
FIG. 3A depicts a common graphical notation of a state diagram that represents a finite state machine as a Mealy machine.
Figures 3B, 4A:
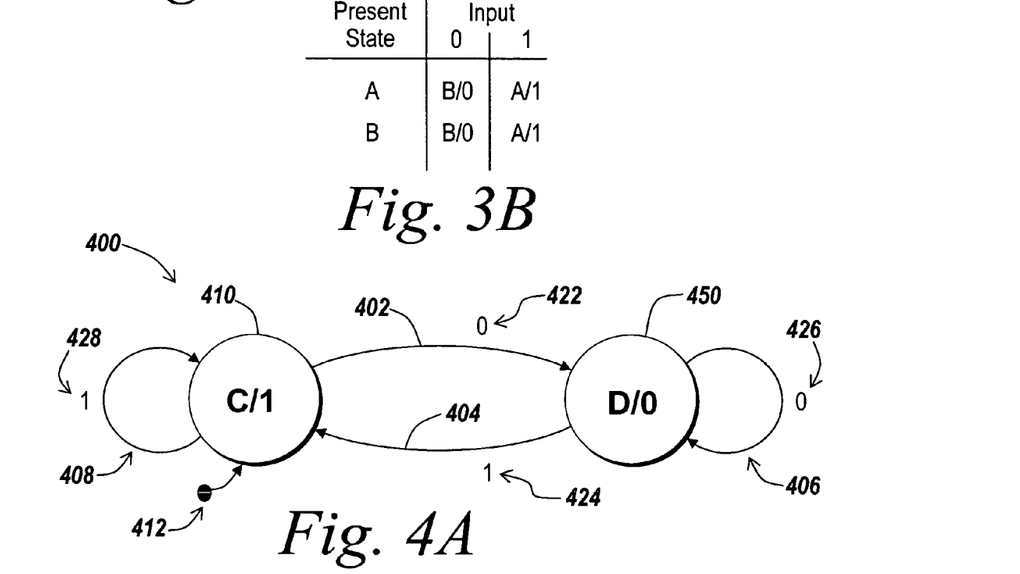
FIG. 3B depicts the state table of the Mealy machine depicted in FIG. 3A.
FIG. 4A depicts a common graphical notation of a state diagram that represents a finite state machine as a Moore machine.

FIG. 3A depicts a common graphical notation of a state diagram of a Mealy machine. State diagram 300 includes default transition 312, states A 310 and B 350 and transitions 302, 304, 306 and 308. The labels 322, 324, 326 and 328 on transitions 302, 304, 306 and 308, respectively, represent the value of the input to and a value of an output from the state diagram. For example, label 322 on transition 302 indicates an input of 0 and an output of 0. The notation used by label 322 is "0/0," where the first 0 represents the value of the input and the second 0 represents the value of the output. The default transition indicates the default state, in this example state A 310, that the state diagram enters upon executions. In state diagram 300 if the present state of the Mealy machine is state A 310 and the state machine receives an input of 1 the state machine transitions to its next state, which in this case is state A 310 again. It is also observed that the state machine outputs a 1 for an input of 1 when the state machine is in state A 310. Conversely, if the state machine receives an input of 0 while in state A 310 the state machine outputs a 0 and the state machine transitions from state A 310 to state B 350. In this case the present state was state A 310 and the next state was state B 350. FIG. 3B depicts a state table representation of the Mealy machine of FIG. 3A.

A Moore machine is a finite state machine that may represent an event based system. For example, a Moore machine may represent a synchronous sequential circuit, also referred to as a clocked sequential circuit. A Moore machine that represents these types of circuits may be referred to as a clock synchronous state machine. Moore machines may also represent continuous time or un-timed systems for which the operation of the Moore machine is not controlled by a clock. In a Moore machine, the outputs are a function of only the present state. Thus, a Moore machine is distinguished from a Mealy machine with respect to how and when the outputs are computed. A Moore machine may be considered a 5-tuple that includes a finite set of states, a finite set of inputs, a finite set of outputs, a transition function, and an output function. A Moore machine may also include accepting states and final states within the finite set of states. The transition function maps a state and an input to the next state such that the next state is a function of the input and the present state. The output function maps each state to an output such that the output is a function of the present state of the Moore machine. The next state of a Moore machine depends on the input and current state of the Moore machine. Therefore, state transitions of a Moore machine occur based on the input to the Moore machine and the current state of the Moore machine. The next state, however, does not depend on the output of the Moore machine. Further, computation of the output does not depend on the next state, nor does it depend on the previous outputs of the Moore machine. Moore machines may represent clock synchronous state machines that use a clock signal to synchronize state changes to the clock signal. It is observed from the discussion above that a Moore machine has a distinct state for each possible output of the Moore machine.

Figure 4B:
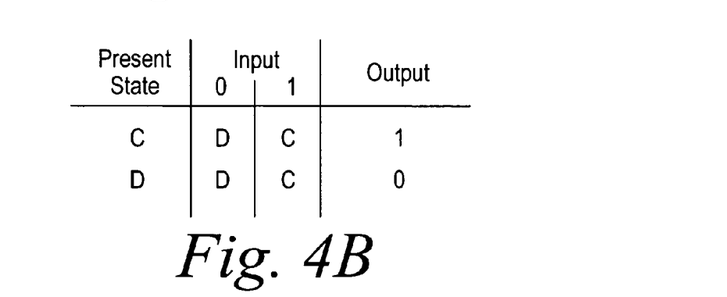
FIG. 4B depicts the state table of the Moore machine depicted in FIG. 4A.

FIG. 4A depicts a common graphical notation of a state diagram of a Moore machine. State diagram 400 includes a default transition 412, states C 410 and D 450 and transitions 402 and 404. The labels 422, 424, 426 and 428 on transitions 402, 404, 406 and 408, respectively, represent the value of the input to the state diagram. For example, label 422 on transition 402 indicates an input of 0. The notation used by label 402 is "0," where the 0 represents the value of the input. In state diagram 400, if the present state of the Moore machine is state C 410 the output of the state machine is 1. Upon receiving an input of 0, the state machine transitions to its next state, which in this case is state D 450. At this time, state D 450 becomes the present state and the state machine outputs a 0. FIG. 4B depicts a state table representation of the Moore machine of FIG. 4A.

In STATEFLOW, state diagram semantics enable a broad range of state diagrams to be implemented. The semantics of STATEFLOW provide three action types that are used in a state diagram. The three action types are entry actions, during actions and exit actions. These action types determine what actions are to be taken according to their relationship to the states.

Figure 5:
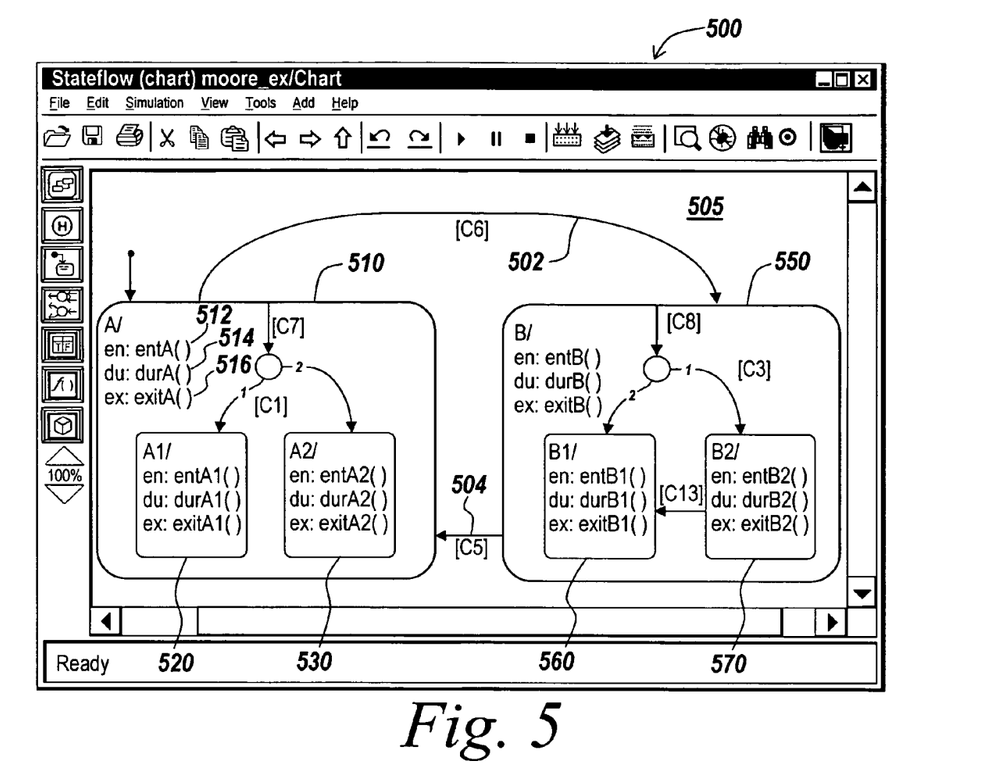
FIG. 5 depicts a screen shot of a state diagram in a conventional state diagramming environment that allows actions on both states and transitions.

FIG. 5 is a screen shot of a state diagram in STATEFLOW. The state diagramming environment 500 depicts a state diagram 505 that includes a state A 510 and a state B 550. State A 510 and state B 550 are connected by transitions 502 and 504. Further, state A 510 is comprised of sub-states A1 520 and A2 530. State B 550 is comprised of sub-state B1 560 and B2 570.

An entry action may be specified such that upon entry of a state an entry action is performed. A during action may be specified in a state diagram such that when an event does not result in an exit from a state that is active, the state executes a during action. An exit action specifies that upon exiting a state an exit action is performed.

STATEFLOW provides notations that define a set of objects and rules that govern the relationship between the objects. STATEFLOW notation includes graphical objects and non-graphical objects. The notation also defines the relationships between each object. Semantics describe how the notation is interpreted and implemented. A state diagram comprises actions associated with transitions and states. The semantics describe the sequence these actions follow during execution of the state diagram.

Additionally, STATEFLOW provides for execution of states using top-down semantics. That is, STATEFLOW allows a state to be composed of multiple states and/or state diagrams, as shown in FIG. 5 by 520, 530, 560 and 570. A state that includes other states is referred to as a super-state. In this manner, a hierarchy may be created in a super-state such that each super-state may be composed of several levels of state diagrams. The states inside a super state are referred to as sub-states. Using top down semantics upon entry of a state that has a hierarchy of states, the execution begins at the highest level (i.e.: the top) of the hierarchy and continues to execute each subsequent lower level until it reaches the lowest level (i.e.: the bottom). Further, in the case of exiting a state with a hierarchy of states and/or state diagrams the STATEFLOW semantics provide a bottom-up execution.

Conventionally, the occurrence of some event may cause a transition to take place, and an action may be executed on both states and transitions. A transition is a graphical object that, in most cases, links one object to another, as shown in FIG. 5 by transitons 502 and 504. One end of a transition is attached to a source object and the other end to a destination object. The source is where the transition begins and the destination is where the transition ends. A transition label describes the circumstances or conditions under which the system moves from one state to another.

A state describes a mode of an event-driven system. The activity or inactivity of the states dynamically changes based on events and conditions. States may specify actions to be executed in a sequence based on action types. For example, in state A 510 of FIG. 5, an entry action 512, a during action 514 and an exit action 516 are specified. In the case where the exit action 516 executes, for example, a transition from state A 510 to state B 550 occurs, where state A becomes inactive, while state B becomes active.

Figure 6:
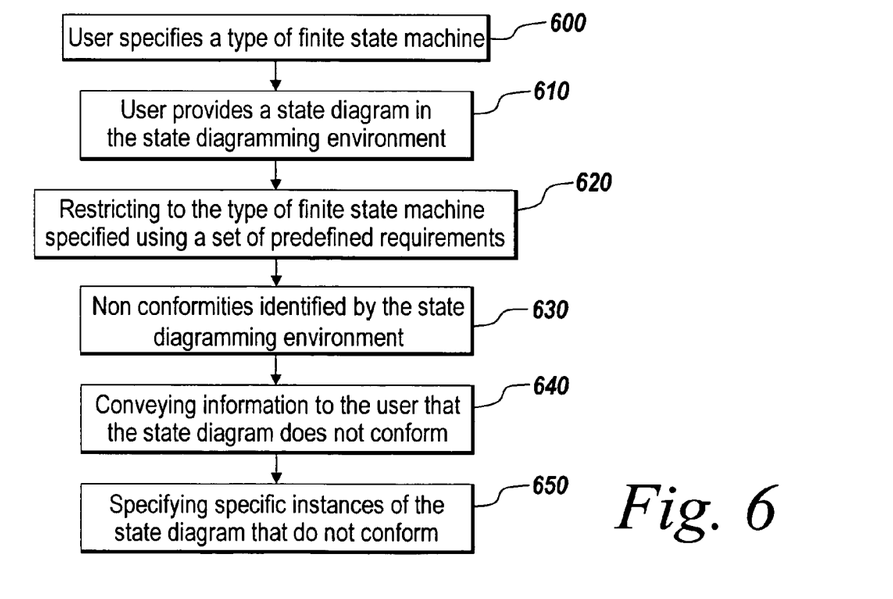
FIG. 6 depicts a flow diagram for implementing the illustrative embodiment of the present invention.

FIG. 6 depicts a flowchart for implementing the illustrative embodiment of the present invention. The illustrative embodiment provides a state diagramming environment, such as STATEFLOW. A user specifies a desire to implement a specific type of finite state machine, in this example a Moore machine is specified (Step 600). In accordance with the present invention, the user may have specified a Mealy machine instead of a Moore machine. The state diagramming environment may provide an interface that allows the user to select the type of finite state machine the user wishes to develop. The user provides a state diagram in the state diagramming environment (Step 610), and is restricted to the Moore machine by the state diagramming environment (Step 620). To restrict the state diagram to a Moore machine a set of predefined requirements are provided.

The set of predefined requirements is used to restrict the syntax and semantics of the state diagram to conform to the semantics of the finite state machine specified. The set of predefined requirements that the state diagramming environment uses based on the type of finite state machine the user desires to implement.

To restrict the state diagram to a Moore machine the state diagramming environment enforces the set of predefined requirements. The set of predefined restrictions limits when actions can occur in the state diagram. As discussed with reference to FIGS. 4A-B, a Moore machine provides that outputs are a function of the present state. A Moore machine may be described as providing actions only on states and not on transitions. The state diagram, therefore, must be restricted to prohibit actions on transitions.

In one embodiment of the present invention, the set of requirements for a Moore machine includes prohibiting entry actions. As discussed above, entry actions are executed as the result of a transition from one state to another. Another requirement to enable the state diagramming environment to restrict the state diagram to a Moore machine is that exit actions must be identical to during actions. Since exit actions are similar to entry actions, that is, they both provide actions on transitions, exit actions are combined with during actions. By combining the during and exit actions and eliminating entry actions, the state diagram is effectively restricted to providing actions on states and not transitions. This allows the state diagram to remove the dependency of the output on the input. As a result, the state diagramming environment restricts the user to a Moore machine. One of ordinary skill in the art will recognize that there are many different ways to restrict state diagram semantics to achieve a Moore machine. For example, exit actions may be prohibited and during and entry actions may be combined.

Figure 7:
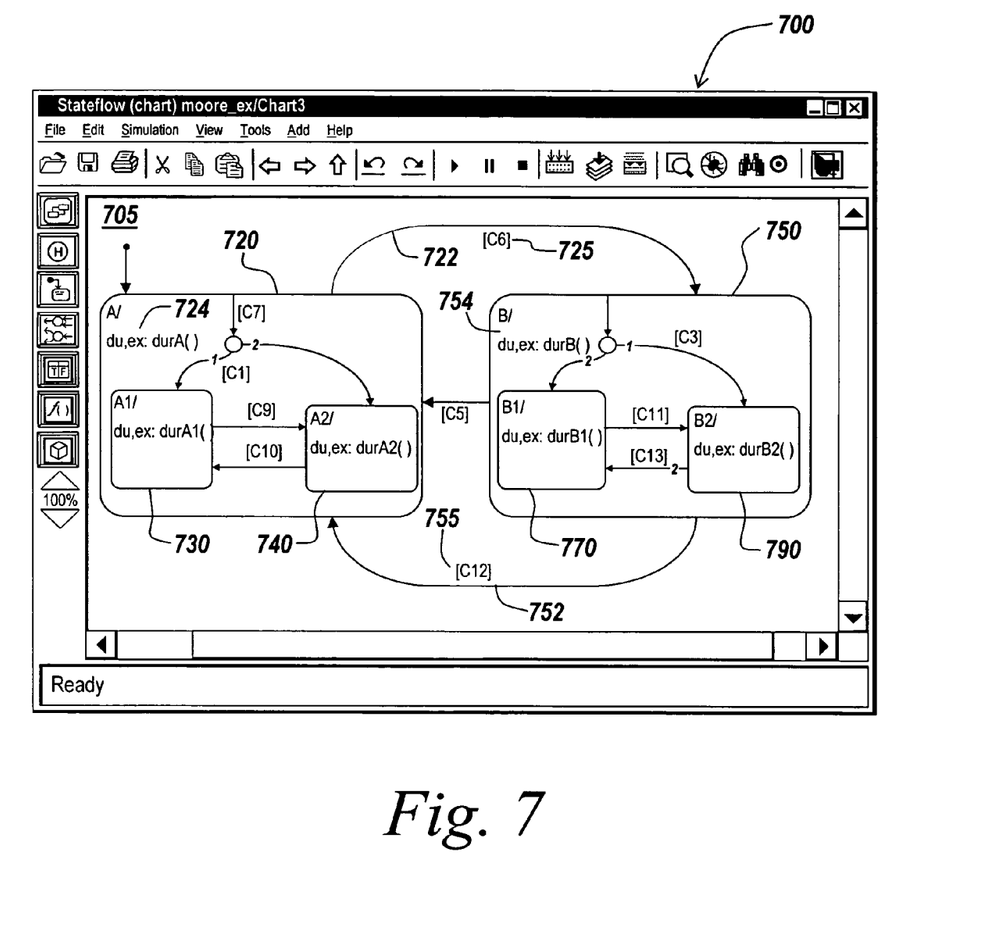
FIG. 7 depicts a screen shot of a state diagram in a state diagramming environment according to one embodiment of the present invention.

FIG. 7 is a screen shot of one aspect of the present invention. The state diagramming environment 700 depicts a state diagram 705 of a Moore machine implemented according to one embodiment of the present invention. The state diagram 705 represents a diagram that was developed using the set of requirements that prohibit entry and makes exit actions and during actions the same. For example, FIG. 7 refers to actions that occur on states as "dur,ex", where the dur,ex action is used to represent the during and exit action since they are the same. Also, no entry actions are specified. Therefore, actions occur only on states when the dur,ex action is executed and no actions occur on transitions. For example, a transition 722 from state A 720 to state B 750 may occur when condition C6 725 is met. In this case, state A 720 becomes inactive and state B 750 becomes active. After becoming active, state B executes the dur,ex action "durB( )" 754 and may continue by executing sub-state 770 or 790. Subsequently, condition C12 755 may be met which causes a transition 752 from state B 750 to state A 720. When transition 752 occurs, state B 750 becomes inactive and state A 720 becomes active. After becoming active, state A 720 executes the dur,ex action "durA( )" 724 and may continue by executing sub-state 730 or 740.

In another embodiment of the present invention, the set of predefined requirements prohibits entry, exit and during actions and introduces a new notation called a state action. The state action is an action that occurs while in a current state. By eliminating entry, exit and during actions and creating a state action the set of restrictions prevents actions from occurring on transitions. In this embodiment, the transitions between states occur on conditions that may depend on an input. When a condition is met the present state may be exited the state becomes inactive and no action is executed. Nor are any actions executed upon entry of the next state. The predefined set of requirements may also prohibit state actions from depending on inputs to the state diagram.

Figure 8:
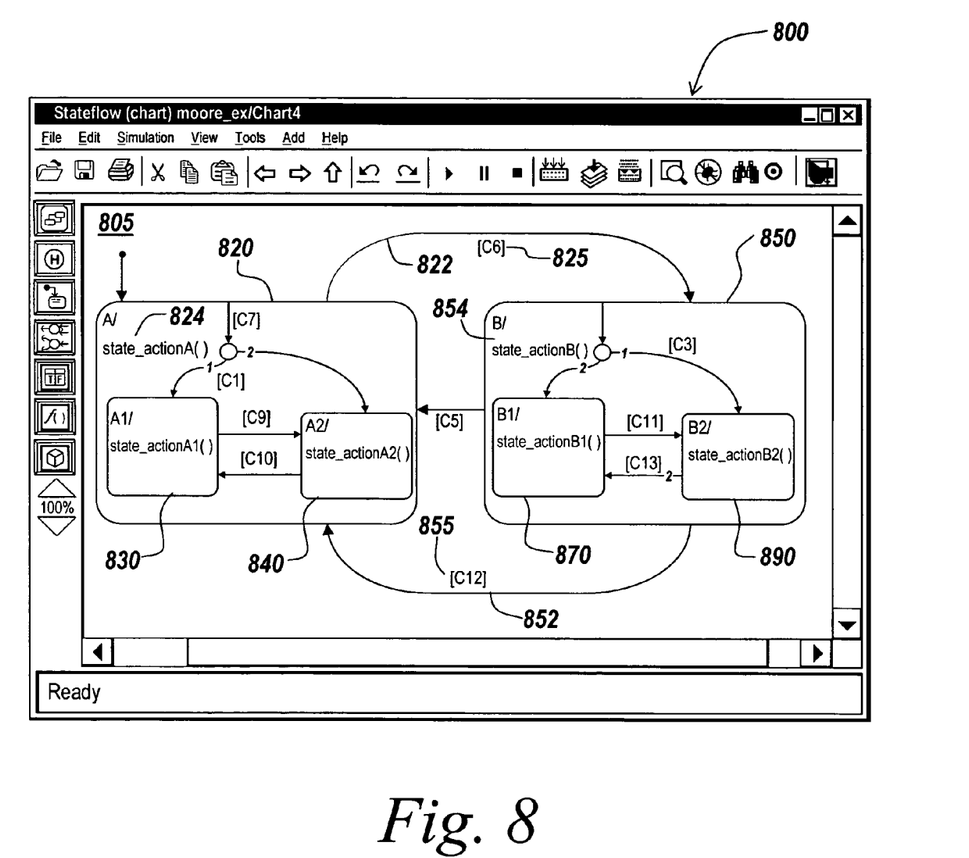
FIG. 8 depicts a screen shot of a state diagram in a state diagramming environment according to one embodiment of the present invention.

FIG. 8 is a screen shot of one aspect of the present invention. The state diagramming environment 800 depicts a state diagram 805 of a Moore machine implemented according to one embodiment of the present invention. The state diagram represents a diagram that was developed using the set of requirements that prohibit entry, exit and during actions and limits actions so that they only occur on states using the new state action notation. FIG. 8 refers to state actions as "state_action". For example, "state_actionA( )" 824 provides that the action specified by this action should be executed on the state. As observed in FIG. 8, no entry, exit or during actions are specified. Therefore, actions occur only on states when the "state_action" action is executed. As a result, no actions occur on transitions. For example, a transition 822 from state A 820 to state B 850 may occur when condition C6 825 is met. In this case, state A 820 becomes inactive and state B 850 becomes active. After becoming active, state B 850 executes the state action "state_actionB( )" 854 and may continue by executing sub-state 870 or 890. Subsequently, when condition C12 855 is met a transition 852 may occur that causes a transition from state B 850 to state A 820. When transition 852 occurs, state B 850 becomes inactive and state A 820 becomes active. After becoming active, state A 820 executes the state action "state_actionA( )" 824 and may continue by executing sub-state 830 or 840.

Further in some aspects, a set of predefined requirements may be used to restrict the type of finite state machine to a Mealy machine. As discussed above, a Mealy machine provides actions on transitions, but not on states. To conform to this, the state diagramming environment may restrict the state diagram to prohibit actions on states. Thus, only actions on transitions are performed. In a similar manner to the Moore machine restrictions, the Mealy machine restrictions may be accomplished by prohibiting during actions and allowing only entry and/or exit actions. Alternatively, the Mealy machine restrictions may prohibit entry, during, and exit actions and introduce a new notation called a transition action.

FIGS. 7 and 8 are examples of a state diagramming environment and are not meant to be limiting. One skilled in the art would recognize that there are many possible ways to implement the set of predefined restrictions. For example, referring to FIG. 5, it is possible that the state diagramming environment may allow the user to specify entry, exit and during actions, and that the state diagramming environment may subsequently enforce the set of requirements to identify the state diagram as non-conforming.

Referring again to FIG. 6, when the user does not conform to the set of predefined requirements, the state diagramming environment identifies the non-conformance (Step 630). In one embodiment the non-conformance is identified by the state diagramming environment while the state diagram is being developed. This identification allows for the identification of non-conformities and the development of the state diagram to occur concurrently. This allows real-time feedback to the user when the state diagram does not conform to the set of requirements.

In another embodiment the non-conformance is identified at the time the state diagram is compiled or parsed by a compiler or a parser. In this case, the user may develop a state diagram before the state diagramming environment identifies any non-conformities. When the user compiles the state diagram, the compiler checks the state diagram for conformance to the set of predefined requirements. To the extent that the state diagram does not conform, the non-conforming aspects of the state diagram are identified.

Referring again to FIG. 6, upon identifying a non-conformance the state diagramming environment conveys information to the user that the state diagram does not conform (Step 640). The information conveyed may provide the user with a general error state or may specify specific instances of the state diagram that do not conform (Step 650).

In one embodiment, the information is conveyed to the user by highlighting the state, transition and/or text associated with the non-conformity. In another aspect, the non-conformity may be conveyed in a separate window, where the window describes the non-conformity either graphically or textually. The state diagramming environment may also provide assistance for conforming to the set of predefined restrictions.

The illustrative embodiment of the present invention enables hardware description language code generation for state diagrams that represent finite state machines. In this manner, the state diagramming environment enables the conversion of a state diagram that represents a type of finite state machine, such as a Moore or Mealy machine, into a hardware description language, such as Verilog or VHDL. The state diagramming environment generates an intermediate representation from the state diagram, which may be represented as a control-flow graph. To do this, the state diagramming environment uses a parser to parse the state diagram into syntactical components and uses the syntactical components to construct the intermediate representation such that the intermediate representation represents the semantics of the state diagram. The state diagramming environment transforms the intermediate representation into a hardware description language specific intermediate representation, which is subsequently converted into a hardware description language representation of the state diagram. The conversion to the hardware description language replaces syntax of the hardware description language specific intermediate representation with a hardware description language specific syntax, and generates a hardware description language code that is representative of the state diagram by mapping the syntax and semantics of the intermediate representation to the syntax and semantics of the hardware description language.

The generated hardware description representation of the state diagram may be implemented in an FPGA, programmable logic devices (PLCs) or any other devices allow configuration or reconfiguration of inputs, outputs and logic structures. As a result a user may configure and/or reconfigure signal conditioning input/output devices. This also enables a user who develops a state diagram to implement the state diagram with off the shelf components.

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include C, C++, C#, or JAVA. The software programs may be stored on or in one or more mediums as object code. Also, part of the software could be run or stored in hardware, for example, by configuring a field programmable gate array (FPGA) or creating an application specific integrated circuit (ASIC).

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A method implemented in a computing device comprising a processor, the method comprising:
   defining a set of state diagram requirements associated with one of a Moore machine type of state diagram or a Mealy machine type of state diagram, the set of state diagram requirements comprising:
      a requirement that actions on states are prohibited if the state diagram requirements are associated with a Mealy machine type of state diagram, or
      a requirement that actions on transitions from one state to another state are prohibited if the state diagram requirements are associated with a Moore machine type of state diagram;
   providing a state diagram in a graphical user interface, where the state diagram includes an indicator, where the indicator:
      indicates that the state diagram is a Moore Machine type of state diagram or a Mealy machine type of state diagram;
   checking the state diagram for conformity with the defined set of state diagram requirements using the processor of the computing device, wherein checking the state diagram for conformity with the defined set of state diagram requirements comprises:
      determining whether the state diagram includes one or more actions on transitions from one state to another state if the state diagram requirements are associated with a Moore machine type of state diagram, or
      determining whether the state diagram includes one or more actions on states if the state diagram requirements are associated with a Mealy machine type of state; and
   generating a notification when the state diagram does not conform to the defined set of state diagram requirements, the notification indicating at least one non-conforming aspect of the state diagram that does not conform to a Moore machine type of state diagram or a Mealy machine type of state diagram.

2. The method of claim 1, where determining whether the state diagram conforms and generating the notification are performed concurrently with providing the state diagram.

3. The method of claim 1, further comprising:
   compiling the state diagram,
   where determining whether the state diagram conforms and generating the notification are performed concurrently with compiling the state diagram.

4. The method of claim 1, further comprising:
   parsing the state diagram,
   where determining whether the state diagram conforms and generating the notification are performed concurrently with parsing the state diagram.

5. The method of claim 1, where the actions on state transitions include entry actions associated with states in the state diagram.

6. The method of claim 1, where the set of requirements combines exit and during actions associated with states in the state diagram.

7. The method of claim 1, further comprising:
   generating a hardware description language representation of the state diagram when it is determined that the state diagram conforms to the defined set of state diagram requirements.

8. The method of claim 1, where the set of requirements prohibits during actions associated with states in the state diagram and enables actions on transitions associated with states in the state diagram.

9. The method of claim 8, where the transitions associated with states in the state diagram include entry actions and exit actions.

10. A method implemented in a computing device comprising a processor, comprising:
    receiving a set of requirements that are associated with a Moore machine type of state diagram or a Mealy machine type of state diagram, the set of requirements comprising:
       a requirement that actions on states are prohibited if the state diagram requirements are associated with a Mealy machine type of state diagram, or
       a requirement that actions on transitions from one state to another state are prohibited if the state diagram requirements are associated with a Moore machine type of state diagram;
    providing a graphical user interface for developing a state diagram;
    receiving a request to develop a Moore Machine type of state diagram or a Mealy machine type of state diagram;
    checking, during development of the state diagram, whether the state diagram conforms to the set of requirements using the processor of the computing device, wherein checking whether the state diagram conforms to the defined set of state diagram requirements comprises:
       determining whether the state diagram includes one or more actions on transitions from one state to another state if the state diagram requirements are associated with a Moore machine type of state diagram, or
       determining whether the state diagram includes one or more actions on states if the state diagram requirements are associated with a Mealy machine type of state; and
    graphically identifying non-conforming aspects of the state diagram in the graphical user interface when it is determined that the state diagram does not conform to the set of requirements.

11. The method of claim 10, where graphically identifying non-conforming aspects further comprises:
    graphically differentiating the identified non-conforming aspects of the state diagram from conforming aspects of the state diagram.

12. A system, comprising:
    a storage for storing instructions executable by the system;

means for receiving a set of requirements that are associated with a Moore machine type of state diagram or a Mealy machine type of state diagram, the set of requirements comprising:
- a requirement that actions on states are prohibited if the state diagram requirements are associated with a Mealy machine type of state diagram, or
- a requirement that actions on transitions from one state to another state are prohibited if the state diagram requirements are associated with a Moore machine type of state diagram;

means for providing a state diagram in a graphical user interface;

means for receiving an indication that that the state diagram is diagram Moore machine type of state diagram or a Mealy machine type of state diagram;

means for compiling the state diagram;

means for parsing the state diagram;

means for checking, during at least one of the compiling or the parsing, whether the state diagram conforms to the set of requirements, wherein checking whether the state diagram conforms to the defined set of state diagram requirements comprises:
- determining whether the state diagram includes one or more actions on transitions from one state to another state if the state diagram requirements are associated with a Moore machine type of state diagram, or
- determining whether the state diagram includes one or more actions on states if the state diagram requirements are associated with a Mealy machine type of state; and means for generating a notification when it is determined that the state diagram does not conform to the set of requirements, the notification indicating at least one non-conforming aspect of the state diagram that does not conform to a Moore machine type of state diagram or a Mealy machine type of state diagram.

13. A computer-readable medium that stores instructions executable by at least one processor, the computer-readable medium comprising:
- one or more instructions for defining a set of state diagram requirements associated with a Moore machine type of state diagram or a Mealy machine type of state diagram, the set of requirements comprising:
  - a requirement that actions on states are prohibited if the state diagram requirements are associated with a Mealy machine type of state diagram, or
  - a requirement that actions on transitions from one state to another state are prohibited if the state diagram requirements are associated with a Moore machine type of state diagram;
- one or more instructions for providing a state diagram in a graphical user interface, where the state diagram includes an indication that the state diagram is a Moore machine type of state diagram or a Mealy machine type of state diagram;
- one or more instructions for checking whether the state diagram conforms to the defined set of state diagram requirements, wherein checking whether the state diagram conforms to the defined set of state diagram requirements comprises:
  - determining whether the state diagram includes one or more actions on transitions from one state to another state if the state diagram requirements are associated with a Moore machine type of state diagram, or
  - determining whether the state diagram includes one or more actions on states if the state diagram requirements are associated with a Mealy machine type of state; and
- one or more instructions for generating a notification when it is determined that the state diagram does not conform to the defined set of state diagram requirements, the notification indicating that at least one aspect of the state diagram does not conform to a Mealy machine type of state diagram or a Moore machine type of state diagram.

14. The computer-readable medium of claim 13, further comprising:
- one or more instructions for conveying the notification to a user of the state diagramming environment.

15. The computer-readable medium of claim 13, where the one or more instructions for conveying the notification further comprise:
- one or more instructions for graphically differentiating the at least one non-conforming aspect from conforming aspects of the state diagram.

16. The computer-readable medium of claim 13, where the one or more instructions for determining whether the state diagram conforms to the defined set of state diagram requirements are performed substantially concurrently with the one or more instructions for providing the state diagram in the state diagramming environment.

17. A system comprising:
- at least one device configured to:
  - receive a set of state diagram requirements corresponding to a Moore machine type of state diagram or a Mealy machine type of state diagram, wherein the set of state diagram requirements comprises:
    - a requirement that actions on states are prohibited if the state diagram requirements are associated with a Mealy machine type of state diagram, or
    - a requirement that actions on transitions from one state to another state are prohibited if the state diagram requirements are associated with a Moore machine type of state diagram,
  - provide a graphical user interface,
  - receive a state diagram in the graphical state diagramming environment,
  - check whether the state diagram conforms to the set of state diagram requirements, wherein checking whether the state diagram conforms to the defined set of state diagram requirements comprises:
    - determining whether the state diagram includes one or more actions on transitions from one state to another state if the state diagram requirements are associated with a Moore machine type of state diagram,
    - or determining whether the state diagram includes one or more actions on states if the state diagram requirements are associated with a Mealy machine type of state; and
  - provide a visual indication in the graphical user interface that the state diagram does not conform to the set of state diagram requirements, the indication indicating at least one non-conforming aspect of the state diagram that does not conform to a Moore machine type of state diagram or a Mealy machine type of state diagram.

* * * * *

UNITED STATES PATENT AND TRADEMARK OFFICE
CERTIFICATE OF CORRECTION

| | | |
|---|---|---|
| PATENT NO. | : 7,840,913 B1 | Page 1 of 1 |
| APPLICATION NO. | : 11/394574 | |
| DATED | : November 23, 2010 | |
| INVENTOR(S) | : Aditya Agrawal et al. | |

It is certified that error appears in the above-identified patent and that said Letters Patent is hereby corrected as shown below:

At column 4, line number 9, please delete "VM's" and insert -- VMs --

Signed and Sealed this
Thirty-first Day of May, 2011

David J. Kappos
*Director of the United States Patent and Trademark Office*